(12) United States Patent
Cheng et al.

(10) Patent No.: US 6,377,666 B1
(45) Date of Patent: Apr. 23, 2002

(54) APPARATUS AND METHOD FOR A PHY TRANSMITTER WITH PROGRAMMABLE POWER MODE CONTROL IN CMOS

(75) Inventors: Yi Cheng, San Jose; Zhenhua Liu, Sunnyvale, both of CA (US)

(73) Assignee: Legerity, Austin, TX (US)

( * ) Notice: Subject to any disclaimer, the term of this patent is extended or adjusted under 35 U.S.C. 154(b) by 0 days.

(21) Appl. No.: 09/181,557

(22) Filed: Oct. 29, 1998

(51) Int. Cl.[7] .............................................. H04M 11/00
(52) U.S. Cl. ................. 379/93.06; 379/399.02
(58) Field of Search ............... 379/93.01, 93.05–93.06, 379/93.08, 399; 327/65–66, 70–71, 106–108, 407, 403; 341/118, 127, 135–136; 326/27, 29, 81–83; 375/258, 289, 327, 376; 340/572.2; 370/468–470; 455/127

(56) References Cited

U.S. PATENT DOCUMENTS

| | | | | |
|---|---|---|---|---|
| 5,307,351 A | * | 4/1994 | Webster | 370/470 |
| 5,359,235 A | * | 10/1994 | Coyle et al. | 327/108 |
| 5,629,641 A | | 5/1997 | Cheng | 327/108 |
| 5,739,780 A | | 4/1998 | Cheng et al. | 341/135 |
| 5,896,417 A | * | 4/1999 | Lau | 375/258 |
| 6,057,765 A | * | 5/2000 | Jones et al. | 340/572.2 |
| 6,072,995 A | * | 6/2000 | Boesch et al. | 455/127 |
| 6,160,436 A | * | 12/2000 | Runaldue | 327/407 |

FOREIGN PATENT DOCUMENTS

| | | | |
|---|---|---|---|
| EP | 0 550 215 A2 | * | 7/1993 |
| EP | 0 664 515 A1 | * | 7/1995 |
| EP | 0 793 347 A1 | * | 9/1997 |

* cited by examiner

Primary Examiner—Duc Nguyen
Assistant Examiner—George Eng
(74) Attorney, Agent, or Firm—McDermott, Will & Emery

(57) ABSTRACT

A transmitter within a line driver circuit is configured to supply data pulses over existing residential wiring. The transmitter is implemented in a CMOS integrated circuit. The transmitter comprises three stages: a front-end digital/analog convertor (DAC), an intermediate DAC, and a current amplifier. The first stage dictates whether the output signal is in high power mode or low power mode. The intermediate DAC, as the second stage, controls the waveform shape and tunes the edge rate, thereby outputting a positive current signal and a negative current signal. The final stage amplifies these current signals to yield current signals having a desired waveform shape, power mode, and edge rate.

5 Claims, 8 Drawing Sheets

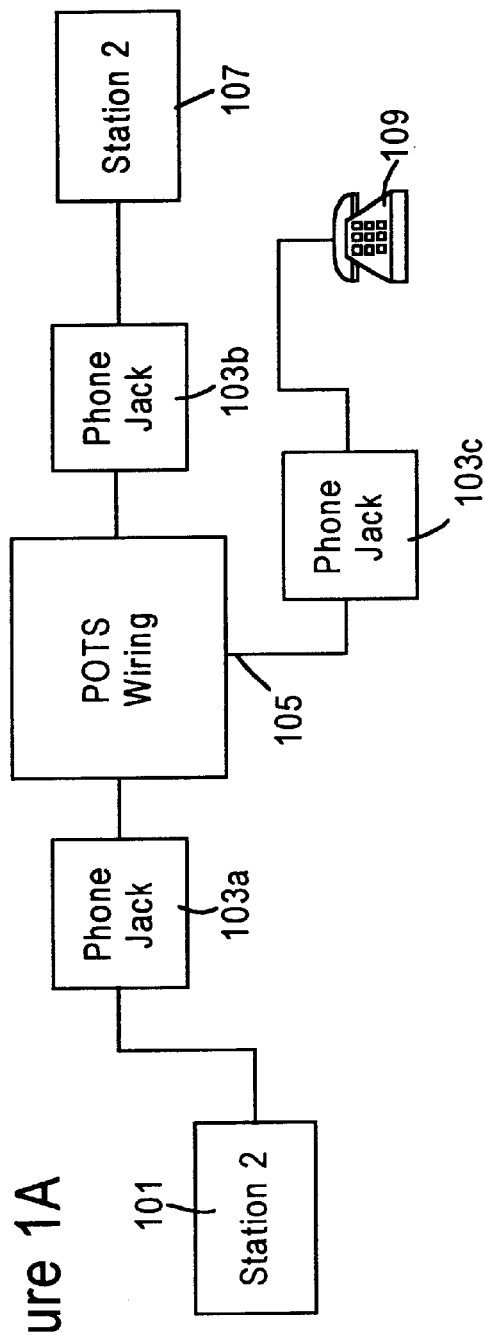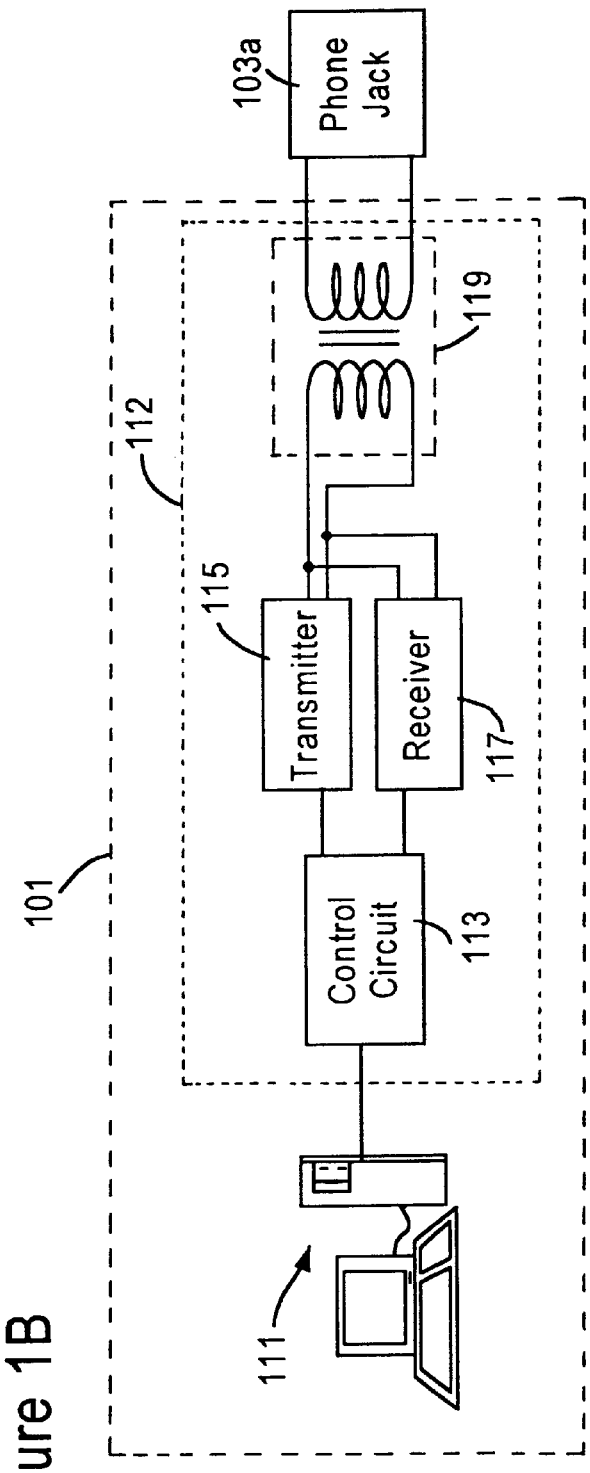
Figure 1A
Figure 1B

APPARATUS AND METHOD FOR A PHY TRANSMITTER WITH PROGRAMMABLE POWER MODE CONTROL IN CMOS

TECHNICAL FIELD

The present invention relates to a transmitter circuit and more particularly, to methods and systems utilizing a programmable control logic for driving data signals over residential wiring, or the like, in a high power mode or a low power mode.

BACKGROUND ART

Local Area Networks (LANs) play a vital role in the successful and efficient operation of the modem office. Workers are able to exchange ideas and documents freely in a collaborative fashion. A LAN also provides a cost effective way to share resources such as information servers, printers, modems, and other peripheral devices. Manufacturers of LAN products continually develop better and lower cost devices, making the implementation of LAN technology viable for even the smallest businesses. Along with the advances in LAN technology, the traditional concept of the office has changed. The modem office has become much more mobile as laptop personal computers are deployed with increasing frequency. Further, the culture of the traditional office has shifted to a more flexible approach in which workers are encouraged to telecommute. Therefore, the personal computer (PC) is becoming a standard "appliance" within the home.

A number of factors contribute to the growing need for PCs in the home. The educational system of today has continued to integrate the use of the PC into the schools' daily curriculum. In addition, the World Wide Web has become a universal knowledge base; as such, millions of homes enjoy access to this invaluable resource. It is not unrealistic that today's families possess multiple computers within the home in which one is dedicated to work and another to conduct personal transactions. In fact, most consumer PC purchases are now largely second purchases. Another key factor is the consumers' need to keep up with the rapid advancement in central processing units (CPUs) to effectively run the latest applications. Thus, consumers are accumulating multiple PCs within their homes.

With an increasing number of homes having multiple PCs, it is a logical extension to try and gain the benefits of a local area network. For example, a printer can be shared to avoid having to unnecessarily purchase multiple printers. Also, communication resources such as modems can be shared, which is desirable given the fact that most homes have only a single line allocated for data communication and facsimile transmissions. The problem, however, is that the conventional home is not appropriately wired for data networking. Nertheless, home phoneline networking has stirred great interest among the public as well as the data networking community.

The concept of home phoneline networking involves the use of standard twisted copper pair cables that exist within most of today's conventional homes for the physical infrastructure of the data network. For example, Ethernet LANs operating at about 1.0 Mbps may be deployed. The data signals coexist with the telephone signals; thus, no additional wiring is required. These data signals are generated by physical (PHY) layer devices (e.g., a transceiver). FIG. 1A shows a typical implementation of the 1.0 Mbps Ethernet network involving two stations 101, 107. These stations 101, 107 are connected to standard RJ-11 phone jacks 103a, 103b, respectively, over plain old telephone service (POTS) wiring 105. While Station 1 (101) and Station 2 (107) are communicating, telephone 109 that is connected to phone jack 103c may continue to make phone calls. An important aspect of this home network is the ability to produce electrical signals cleanly over the POTS wires. Past attempts at home phoneline networking have been thwarted by electrical noise problems stemming from reflections to poor wire conditions.

FIG. 1B represents an exploded view of Station 1 (101), in which a PC 111 interfaces with a line circuit 112 (or transceiver) to transfer data. The line circuit 112 conventionally has a transmitter 115 for sending the data signals and a receiver 117 to retrieve data signals from another station. Line coupler 119, which connects to phone jack 103a, conditions the signals for transmission over the POTS wire.

With common residential phone wiring, the line circuit 112 needs to drive over a specific voltage swing; that is, a specific power mode. FIG. 5 shows a conventional line circuit 112 having two transmit drivers 505, 507. The line circuit 112 also has a receiver 503. Essentially, the line circuit 112 is required to drive under two power modes, a high mode and a low mode, as well as at different transmit rates on a 50Ω load. The conventional line circuit 112 addresses the above requirements separately, using two different power mode drivers. Driver 505 operates in low power mode, whereby the transmitter waveform has a peak to peak level of about 0.6 V. The other driver 507 is a high power mode driver, which exhibits a peak to peak voltage level of 1.2 V. Because two drivers 505, 507 are used, a complementary metal oxide semiconductor (CMOS) integrated circuit (IC) must have a minimum of six nodes and eight external resistors. The nodes are for the following signals: low power mode transmit negative signal (Tx_n), voltage for gain control—lower power mode (VGL), low power mode transmit positive signal (Tx_p), high power mode transmit negative signal (TxHP_n), voltage for gain control—high power mode (VGH), high power mode transmit positive signal (TxHP_p). The number of nodes corresponds to the number of pins required by the IC. The higher the number of pins, the larger the die size must be. External resistors also occupy precious chip real estate; further, they consume more power. Resistive circuit 501 has eight resistors, in addition to the load resistance. Thus, in IC fabrication, a large number of nodes and external resistors, as required by the use of two drivers, significantly increases the cost of the IC.

DISCLOSURE OF THE INVENTION

There is a need for a line circuit that utilizes a minimal number of nodes for the transfer of signals, and reduces the pin count required by the IC for implementation. There is also a need for a line circuit that reduces or eliminates entirely the use of external resistors. In addition, there is a need for driving a residential transmission line in two power modes using a single driver.

These and other needs are attained by the present invention, where a line driver circuit employs two nodes and no external resistors to transmit signals exhibiting the desired power mode, waveform shape, and edge rate over residential grade wiring, or the like.

In accordance with one aspect of the present invention, a line circuit for transmitting data signals as positive and negative output currents in a data communication network. The line circuit comprises a digitally controlled current source. A single current amplifier is coupled to the digitally controlled current source for generating the positive output current and the negative output current in different power modes. The single current amplifier is driven by the digitally controlled current source. Hence, the line circuit advantageously supplies output currents in two different power modes using a single driver.

Another aspect of the present invention provides a line circuit for transferring data over residential grade wiring. The line circuit comprises programmable control logic configured for generating a digital power level control (DLC) signal, a positive control signal, and a negative control signal. The DLC signal specifies a high power mode or a low power mode. The positive control signal and the negative control signal indicate waveform shape and edge rate information associated with a positive output current and a negative output current. A front-end digital/analog convertor (DAC) is configured for receiving the DLC signal and generating an output signal of the specified power mode. An intermediate DAC is configured for receiving the output signal of the front-end DAC, the positive control signal, and the negative control signal. The intermediate DAC outputs a positive current signal and a negative current signal. A single differential current amplifier is configured for receiving the positive current signal and the negative current signal. Correspondingly, the single differential current amplifier generates the positive output current and the negative output current in the high power mode or the low power mode. Under this arrangement, the number of pins of the line circuit can be reduced to only two for the output current as well as incoming signals for the receiver side.

Yet another aspect of the invention provides a method for transmitting data signals over a data communication network utilizing residential cabling. The method comprises supplying control information to a digitally controlled current source and, in response, driving a single current amplifier. Additionally, the method comprises outputting a positive current and a negative current by the single current amplifier in different power modes based upon the control information. Therefore, data signals can be transmitted over traditional telephone wiring using a low cost line circuit.

Additional advantages, and novel features of the present invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein:

FIGS. 1A and 1B are block diagrams illustrating a LAN deployed over residential wiring and an exploded view of one of the stations.

DETAILED DESCRIPTION OF THE INVENTION

Although the present invention has direct applicability to transmission of data signals over low grade residential type wiring, it will become apparent, however, that the present invention is also applicable to other cabling infrastructures (e.g, category 3 cables, category 5 cables, thin coaxial cables, etc.). The present invention contemplates that the preferred embodiment is implemented as a single CMOS integrated circuit.

Figure 2:
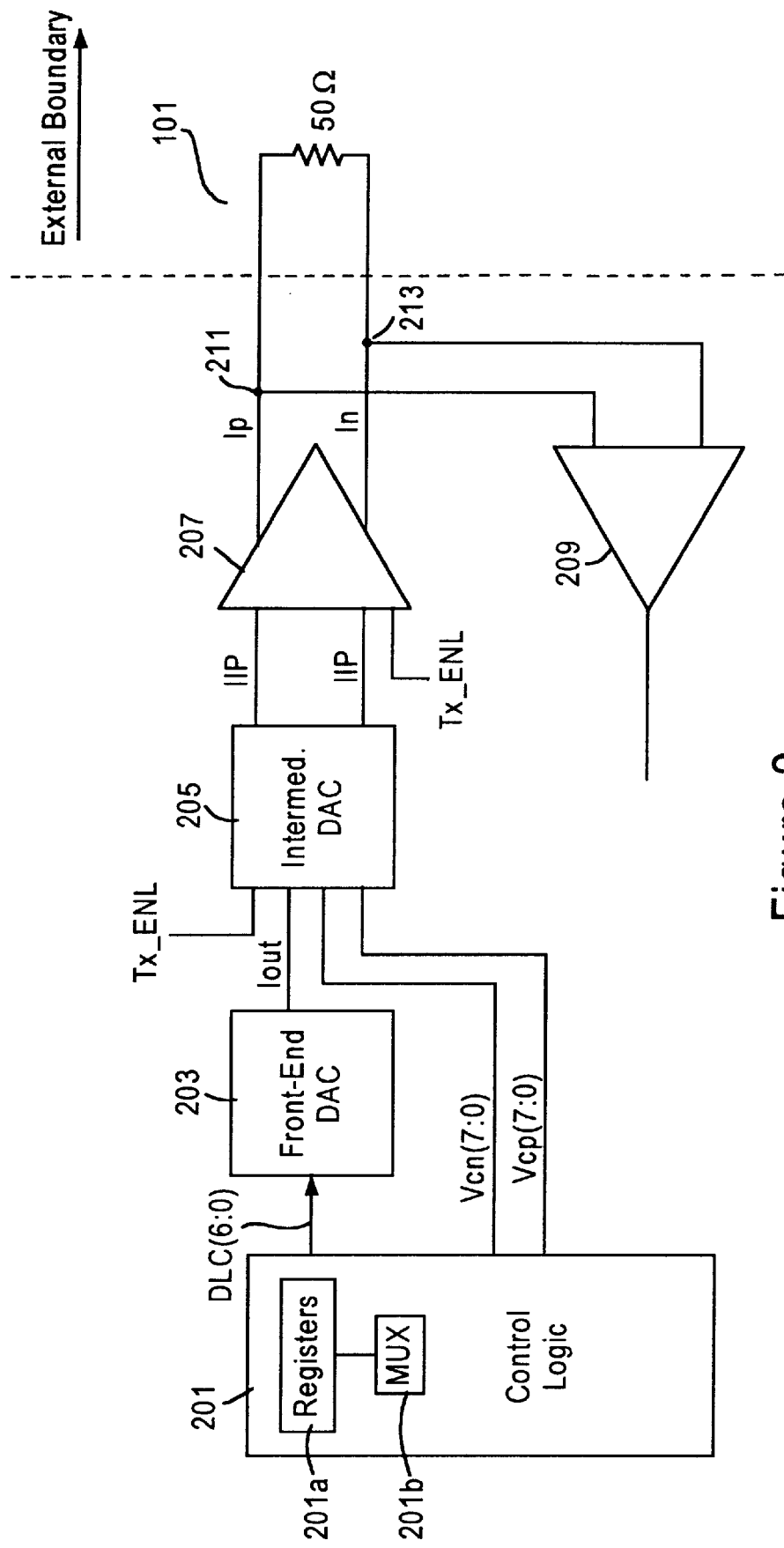
FIG. 2 is a block diagram illustrating a line driver circuit according to an embodiment of the present invention.

According to the present invention, FIG. 2 shows the transmitter circuit 115 (FIG. 1B) with three stages: a front-end digital/analog convertor (DAC) 203, an intermediate DAC 205, and a current amplifier 207. In general, the first stage, DAC 203, controls the power mode; and the second, DAC 205, provides waveform shaping, fine tuning of the edge rate, and selection of the power mode. Lastly, the third stage, which is a current amplifier 207, amplifies the output signals of the second stage for transmission of the signals over twisted pair cables. By employing a three stage approach, the need for a second driver is obviated. Moreover, the two differential output pins 211 and 213 can be shared with a receiver 209, thereby reducing the number of pins. It is also evident that no external resistors are employed in the external boundary 101. The only resistance is that of the 50Ω transmission load. The three stages of this transmitter circuit 115 are further described below. Throughout the discussion of these three stages, the labels of the terminals within the schematic diagrams (FIGS. 3A, 3B, and 3C) also designate the signals themselves (e.g., the output terminals also denote the output signals).

Control logic 201 makes possible the benefits described above by controlling the operation of the DACs 203, 205. This logic 201, which comprises digital registers 201a and a multiplexer 201b, generates the following control signals: digital power level control (DLC), voltage control negative (Vcn), and voltage controlled positive (Vcp). The DLC signal is 7 bits in length. Both the Vcn and Vcp are preferably 8 bits. The DLC signal is supplied only to front-end DAC 203. The digital registers 201a within the control logic 201 store the necessary bit pattern, which indicates a high power or a low power mode. For example, a pattern of 0001011 may signify a low power mode, and a 0010110 pattern indicates a high power mode. Within the control logic circuit 201, there is a multiplexer 201b that selects the content of the registers based upon external parameters. For example, if the receiver logic (not shown) detects unacceptably high bit errors in transmission, then control logic 201 would be instructed by the receiver logic (not shown) to transmit in high power mode to overcome the poor signal characteristics. The detection may be determined by the receiver every time the line circuit is activated, in which the receiver tests the transmission line for the bit error rate (BER). Factors influencing the BER include the grade and condition of the transmission wire, electromagnetic interference, and length of the transmission line.

Methods for determining BER are well-known. Alternatively, the power mode can be predesignated by setting a switch (e.g, a dip switch) because distances are typically known in a residential environment. The line driver, therefore, does not have to wait for the receiver to provide information as to which power mode to transmit in.

Once an excessively high bit error rate is detected, multiplexer 201a selects the 0010110 pattern, which corresponds to the high power mode, to be stored in the registers 201a. This information is conveyed to the front-end DAC 203 via the DLC signal. Optionally, more than two power modes (e.g., low, medium, high modes) may be used to better match different BER conditions; the closer the match, the greater the saving in power consumption.

The front-end DAC 203, in response to the DLC signal, outputs a current signal, Iout, to the intermediate DAC 205.

The intermediate DAC 205 additionally receives the Vcn and Vcp signals from the control logic 201. These signals dictate the waveform shape and control the edge rate as well as the power mode. The input signals, DLC, Vcn, and Vpn, may be readily programmed for numerous possible resolution levels of power mode and selection of edge rates to the current amplifier 207. Further, the intermediate DAC 205 receives as input a transmit enable signal (Tx_ENL). This global signal dictates whether the line circuit may transmit data signals. Based on the various input signals, the intermediate DAC 205 outputs a current input positive signal (IIP) and a current input negative signal (IIN). These signals are supplied to current amplifier 207, which in response outputs a positive output current (Ip) as well as a negative output current (In).

Figure 3A:
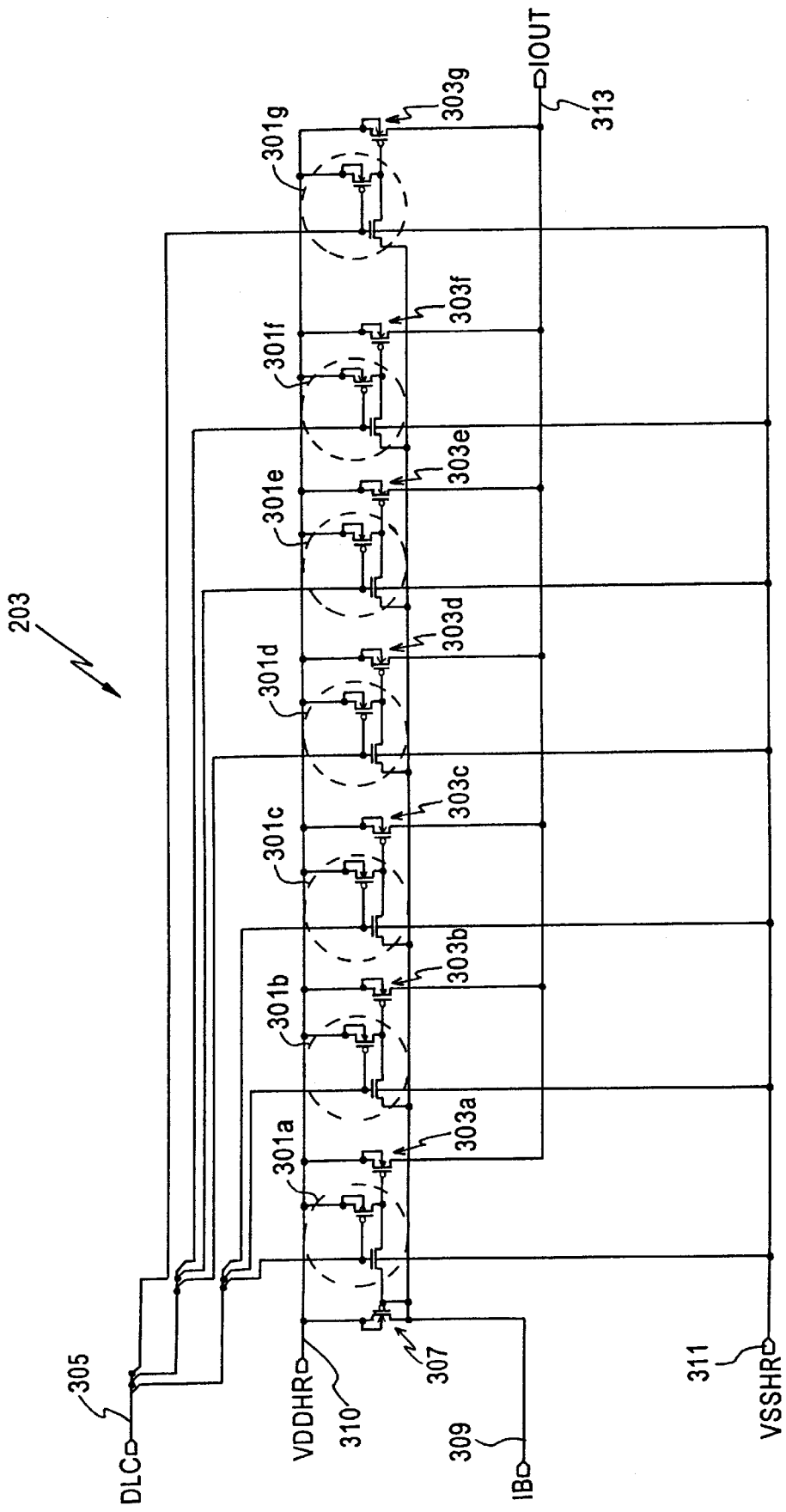
FIGS. 3A, 3B, and 3C are circuit diagrams of the three stages (front-end DAC, intermediate DAC, and current amplifier) of the line circuit corresponding to FIG. 2.

As the first stage, the front-end DAC 203 includes circuitry, as shown in FIG. 3A, that converts a sequence of positive digital data samples into a first electrical current and a sequence of negative digital data samples into a second electrical current. The front-end DAC 203 uses dynamic current mirror circuitry to generate an analog waveform by combining and amplifying the first and second electrical currents. The front-end DAC circuit 203 includes a set of switching transistors 301a–301g and a set of current mirrors 303a–303g. The switching transistors 301a–301g are controlled by a 7 bit DLC signal. With 7 bits, there are 128 power level settings that may be specified. Each of the current mirrors 303a–303g duplicates the supply circuit 307.

The switching transistors 301a–301g independently switch ON and OFF the current mirrors 301a–301g according to the digital samples carried by the DLC signal. VDDHR (310) is the voltage supply, and VSSHR (311) is the ground line. IB at input mode 309 is the reference current source, which typically is 25μA, and is fed to the source transistor 307. This current is then mirrored through those current mirrors 303a, 303b, 303c, 303d, 303e, 303f, and 303g, that are switched ON according to the DLC signal of 305. The switched ON current mirrors yield a sum of currents at the node 313 as an output current Iout. The current mirrors 303a–303g are binary weighted. For example, current mirrors 303a, 303b, 303c, 303d, 303e, 303f, and 303g each has a binary weighting of 1, 2, 4, 8, 16, 32, and 64, respectively. With this weighting arrangement, there are 128 possible current values (i.e., resolution levels). Ultimately, the mirrors that are switched ON are summed and outputted as Iout 313, which is supplied to the intermediate DAC 205.

Figure 3B:
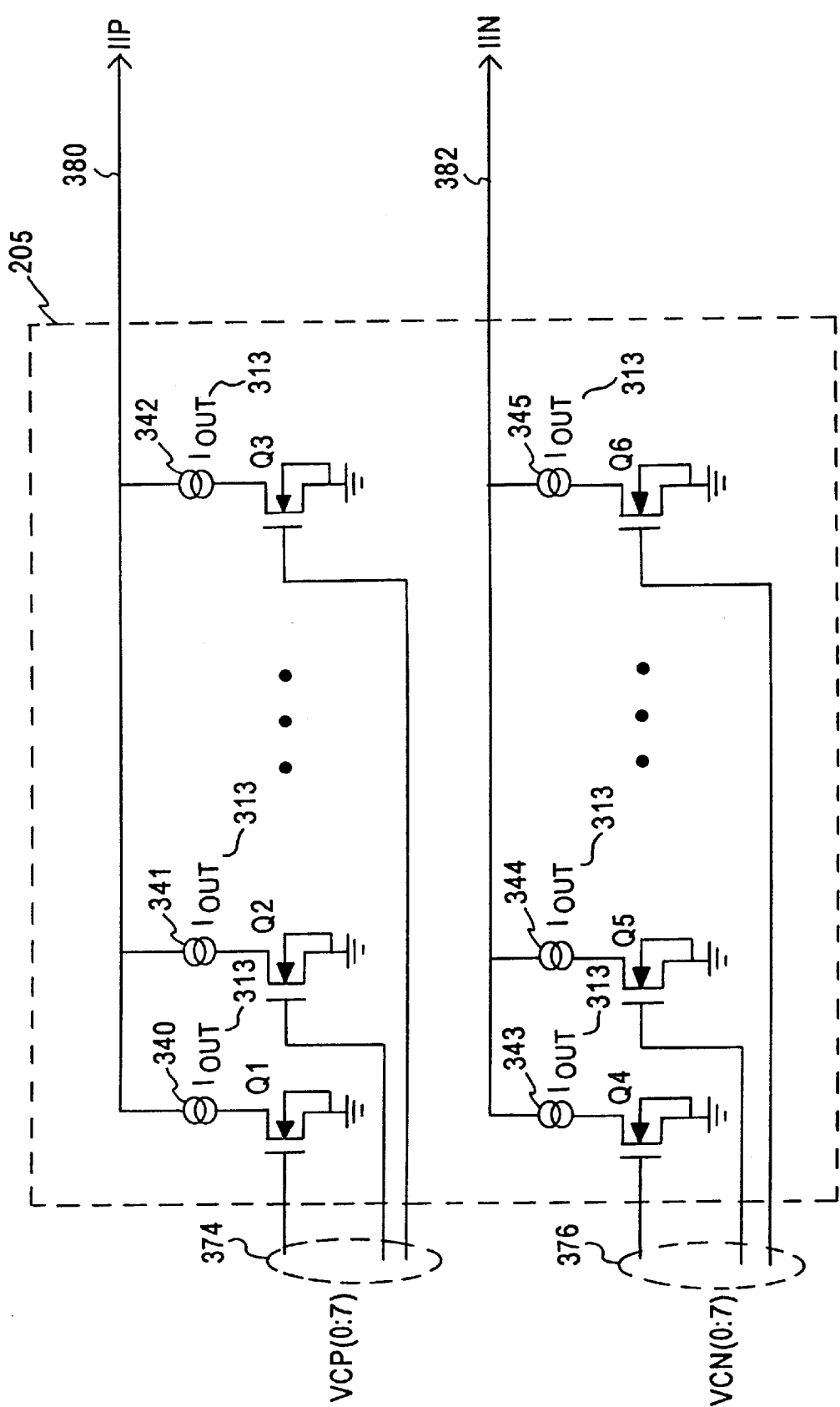

The intermediate DAC circuit 205 includes circuitry, depicted in FIG. 3B, which independently generates a current input positive (IIP) signal and a current input negative (IIN) signal. The IIP 380 and IIN 382 signals represent the positive and negative portions of a synthesized waveform. FIG. 3B illustrates the intermediate DAC 205 in one embodiment. The intermediate DAC circuit 205 includes a set of transistors Q1–Q3 and a set of current mirrors 340–342 that provide a positive portion of a single-ended analog to digital conversion function. Each of the current mirrors 340–345 duplicates the Iout 313 current as supplied by the front-end DAC 203. It should be noted that the simplified schematic of FIG. 3B does not show that the Iout 313 from the front-end DAC is attached to the current mirrors 340–345; instead, Iout 313 is represented as a signal that is mirrored by 340–345. Also, the Tx_ENL signal (FIG. 2) is not shown in this figure; however, it should be appreciated that this global signal must be high for the intermediate DAC 205 to operate. The transistors Q1–Q6 function as switches that are responsive to the wave shaping data signals, Vcp 374 and Vcn 376. The wave shaping data signal Vcn 374 carries the digital samples corresponding to positive portions of the synthesized waveform. Likewise, the Vcp 376 signal provides information about the negative portions of the synthesized waveform. In certain preferred embodiments, these signals Vcn 374 and Vcp 376 are 8 bits. The transistors Q1–Q6 also independently switch ON and OFF the current mirrors 340–345 according to the Vcp 374 and Vcn 376. The switched ON current mirrors 340–342 yield a sum of currents at the node 380, to provide the IIP signal. Correspondingly, switched ON current mirrors 343–345 supply a sum of currents at node 382 for the IIN signal. These signals, IIP (380) and IIN (382), are supplied to the current amplifier circuit 207 (FIG. 2).

The differential current amplifier 207, which is a current controlled current source, may be implemented as a class B amplifier with low power consumption. An exemplary embodiment of an amplifier 207 is shown in FIG. 3C.

Figure 3C:
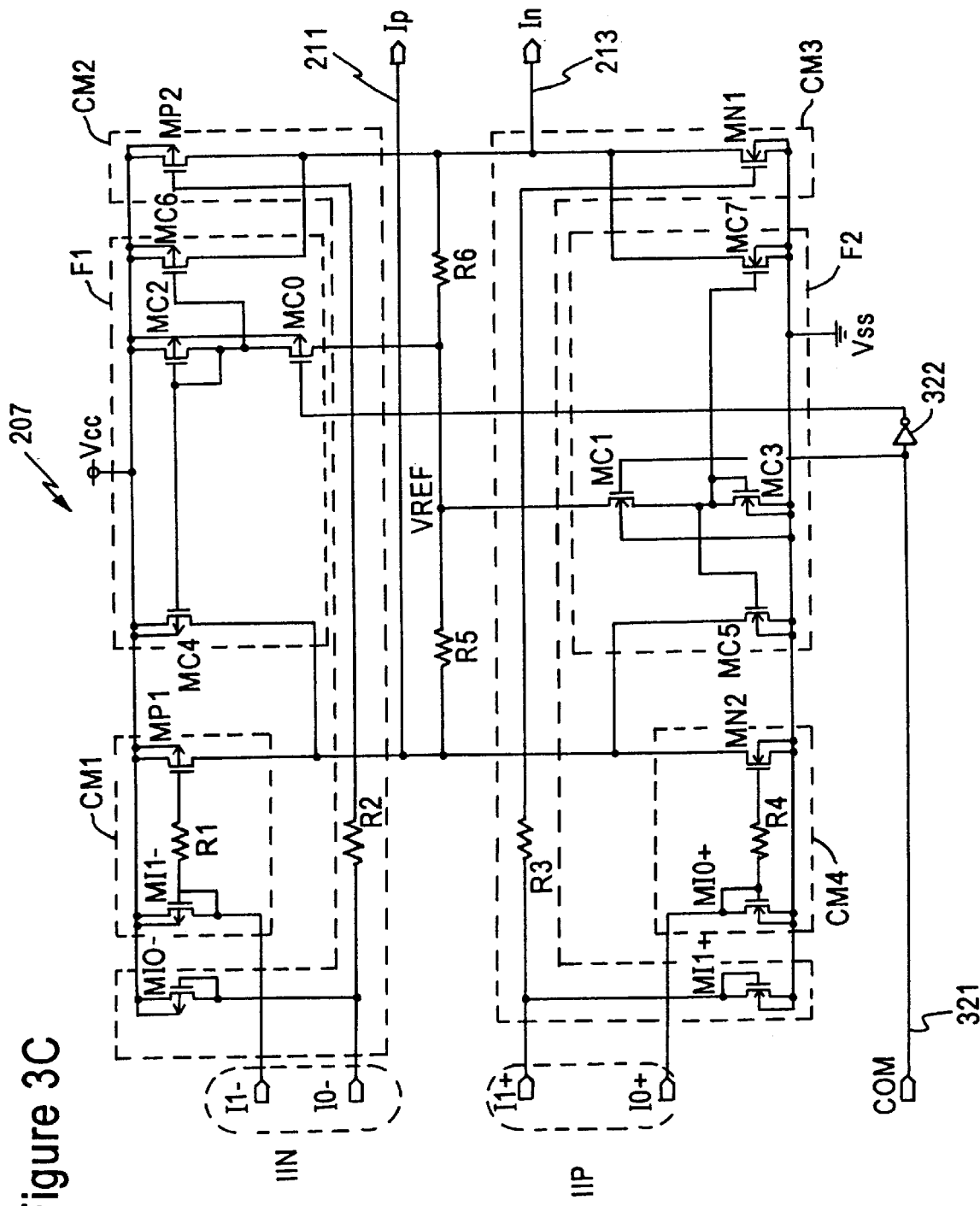

FIG. 3C shows a schematic of the differential current amplifier 207 of FIG. 2 connected to a predetermined source voltage (VCC) and a predetermined reference voltage (VSS) of 0V or ground. The current amplifier 207 receives the same Tx_ENL signal (not shown) as the intermediate DAC 205; this signal enables the amplifier 207 to function when the signal is a logical high. The current amplifier 207 has a number of current mirrors CMI, CM2, CM3 and CM4 coupled to the input terminals I1−, I0−, I1+ and I0+, respectively. IIN corresponds to I1− and I0−; and IIP to I1+ and I0+. That is, I1− and I0− are mirrored from IIN, and I1+ and I0+ are mirrored from IIP. In addition, a pair of common mode feedback circuits F1 and F2 are connected to the voltage dividing resistors R5 and R6 to reduce the common mode voltages at the output terminals 211 (Ip) and 213 (In). It should be noted that the labels for the actual signals (e.g., Ip and In) and the terminals (e.g., 211 and 213) are used interchangeably to refer to the signals. The voltage dividing resistors R5, R6 also conductively couple together Ip (211) and In (213) such that current mirrors CM1–CM4 are arranged in a bridged configuration. The bridged configuration prevents production of quiescent currents; that is, there are no output signals when no input signals are present at the input terminals, I1−, I0−, I1+ and I0+. The current mirrors CMI and CM4 are connected to the output terminal Ip (211). Likewise, current mirrors CM2 and CM3 are coupled to In (213). The four current mirrors, CM1–CM4, essentially output currents to one of the two output terminals 211 (Ip) and 213 (In) in response to the input signals, I1−, I0−, I1+, I0+. The structure of these mirrors CM1–CM4 are discussed below.

The current mirror CM 1 typically comprises a PMOS transistor MI1− with its gate connected to a resistor R1, conductively coupling the transistor MI1− to the gate of PMOS transistor MP1. The source of the transistor MI1− is connected to the predetermined source voltage VCC, and its drain is connected to the input terminal I1−. The source of the transistor MP1 is connected to VCC, while its drain is connected to Ip (211). The resistor R1 provides a current path mirroring the input transistor MI1− to the output transistor MP1 in response to the input signal at the input terminal I1−. Current mirror CM2 has a configuration similar to CM1, but is responsive to the input signal at the input terminal I0− for outputting a mirroring current at Ip (211). CM2 comprises a PMOS transistor MI0−, a resistor R2 and a PMOS transistor MP2.

The current mirror CM3 comprises an NMOS transistor MI1+ with a gate connected to a resistor R3, conductively coupling the transistor MI1+ to a gate of a NMOS transistor MN1. The sources of the transistors MI1+ and MN1 are connected to VSS. The drain of transistor MI1+ is connected to input terminal I1+. The drain of MN1 is connected to the output terminal In (213). The resistor R3 provides a current path mirroring the input transistor MI+ to the output transistor MN1 in response to the input signal at the input terminal I1+. In a similar configuration, CM4 comprises an NMOS transistor MI0+, a resistor R4, and an NMOS transistor MN2. CM4 receives input signals from I0+ and outputs a mirroring current to Ip (213).

The operation of the current amplifier 207 is as follows. Although not shown, the Tx_ENL signal is an input to the current amplifier 207 and must be a logical high for the amplifier 207 to function. During a time period Ti, the transistors MI1− and MI1+ of the current mirrors CM1 and CM3 start to turn ON in response to the rise and fall, respectively, of the input signals at I1− and I1+. This causes MP1 and MN1 to mirror the current at transistors MI1− and MI1+. MP1 increases the output current Ip at output terminal 211, while MN1 reduces the current level at In. When the input signals at I0− and I0+ go low and high, respectively, during a time period T2, MI0− and MI0+ of the current mirrors CM2 and CM4 turn ON, causing the current flows to be mirrored at MP2 and MN2. As a result, the output current In (213) is raised by MP2, and the output current Ip (211) is reduced by MN2.

A COM signal (321) is used to enable or disable a first common mode feedback circuit F1 and a second common mode feedback circuit F2. The first common mode feedback circuit F1 comprises PMOS transistors MC0, MC2, MC4, and MC6; the F2 circuit is made up of MC1, MC3, MC5, and MC7. These common mode feedback circuits, F1 and F2, are connected to a node VREF to receive a common mode output voltage level between the resistors R5 and R6. When the COM signal (321) is at a logic high, the transistors MC0 and MC1 are enabled since the transistors MC0 and MC1 function as resistive elements. When the COM signal (321) is at a logic low, the transistors MC0 to MC1 are inactive since MC0 and MC1 are open circuits. When F1 and F2 are enabled, a common mode output voltage level is taken from the node VREF, between resistors R5 and R6. The nominal voltage at the node VREF is mostly controlled by the resistivity ratio between R5 and R6.

When VREF changes from the nominal value, the current densities in transistors MC0, MC2, MC1 and MC3 also change from their nominal values. The change of a drain-source current $I_{ds}$ for the transistor MC2 mirrors to the MC4 and MC6, and the change of a drain-source current $I_{ds}$ for the transistor MC3 mirrors to the transistors MC5 and MC7. For example, when Ip and In have a positive increment of the common mode voltage, there is a positive increment of the nominal voltage at VREF. The current $I_{ds}$ of both MC2 and MC3 decrease, causing an increase in current $I_{ds}$ of MC4 and MC6, thereby decreasing the common mode voltages at the Ip (211) and In (213).

As mentioned before, the common mode feedback circuits F1 and F2 prevent development of the common mode output voltages, where both signals Ip (211) and In (213) increase or decrease at the same time. The common mode output voltage is generally undesirable in the differential current amplifier 207, where the Ip (211) and In (213) signals increase or decrease at the same time. Without the F1 and F2 circuits, distortion of the Ip (211) and In (213) signals is inevitable. As can be appreciated, NOT gate 322 can be eliminated to enable the circuits F1 and F2.

Current mirrors CM1 and CM3 are commonly controlled; as are CM2 and CM4. These current mirrors are arranged in a bridged network with CM1 and CM3 in the first and third legs of the bridge network, respectively. CM2 and CM4 are in the second and fourth legs of this network. In this manner, only two current mirrors are ON at the same time; CM1, CM3 and CM2, CM4 are controlled complementary to each pair. For example, if the I1− falls and I1+ rises, CM1 and CM3 turn ON. However, since I0− and I0+ are at high and low logic levels, respectively, CM2 and CM4 are OFF. When CM2 and CM4 are turned ON, in response to the input signals of low and high logic levels, respectively, the current mirrors CM1 and CM3 are turned OFF.

The resistors R1, R2, R3 and R4 are used to provide path mirroring of the input currents from input transistors MI0−, MI0+, MI1−, and MI1+ to the output transistors MP2, MN2, MP1, and MN1, respectively. The input transistors MI0+ and MI1+ are sized to 1/M of the output transistors MN2 and MN1. MI0− and MI1− are sized to 1/N of MP2 and MP1, where the preselected constants M and N are mirroring ratios in the current mirrors CM1–CM4 to amplify the input current to a sufficient strength to drive an output load, such as a transmission line (e.g., 50 ohms), connected to output terminals Ip (211) and In (213). Likewise, MC2 is sized to $1/K_1$ of transistors MC4 and MC6, while MC3 is sized to $1/K_2$ of MC5 and MC7. The preselected constants $K_1$ and $K_2$ are mirroring ratios to control the amount of the mirroring current. Further, resistors R5 and R6 generally have substantially the same resistivity. Hence, the resistive values and mirroring ratios can be chosen to meet the design requirements.

Furthermore, the frequency response bandwidth can be easily controlled. The resistor network (R1 through R4) together with the transistor gate capacitance are used to control the RC time constant from the input to the output. The amplifier's nominal pole can be easily placed by specifying the resistor or MOS transistor size.

The differential current amplifier 207 in accord with the preferred embodiment provide a number of advantages. For instance, since all transistors operate in a current mode, the operating characteristics of MOS transistors are best utilized. In addition, the amplifier 207 exhibits low power consumption. Practically no quiescent current is required in the output transistors. Also, common mode output voltage is minimized.

Figure 4A:
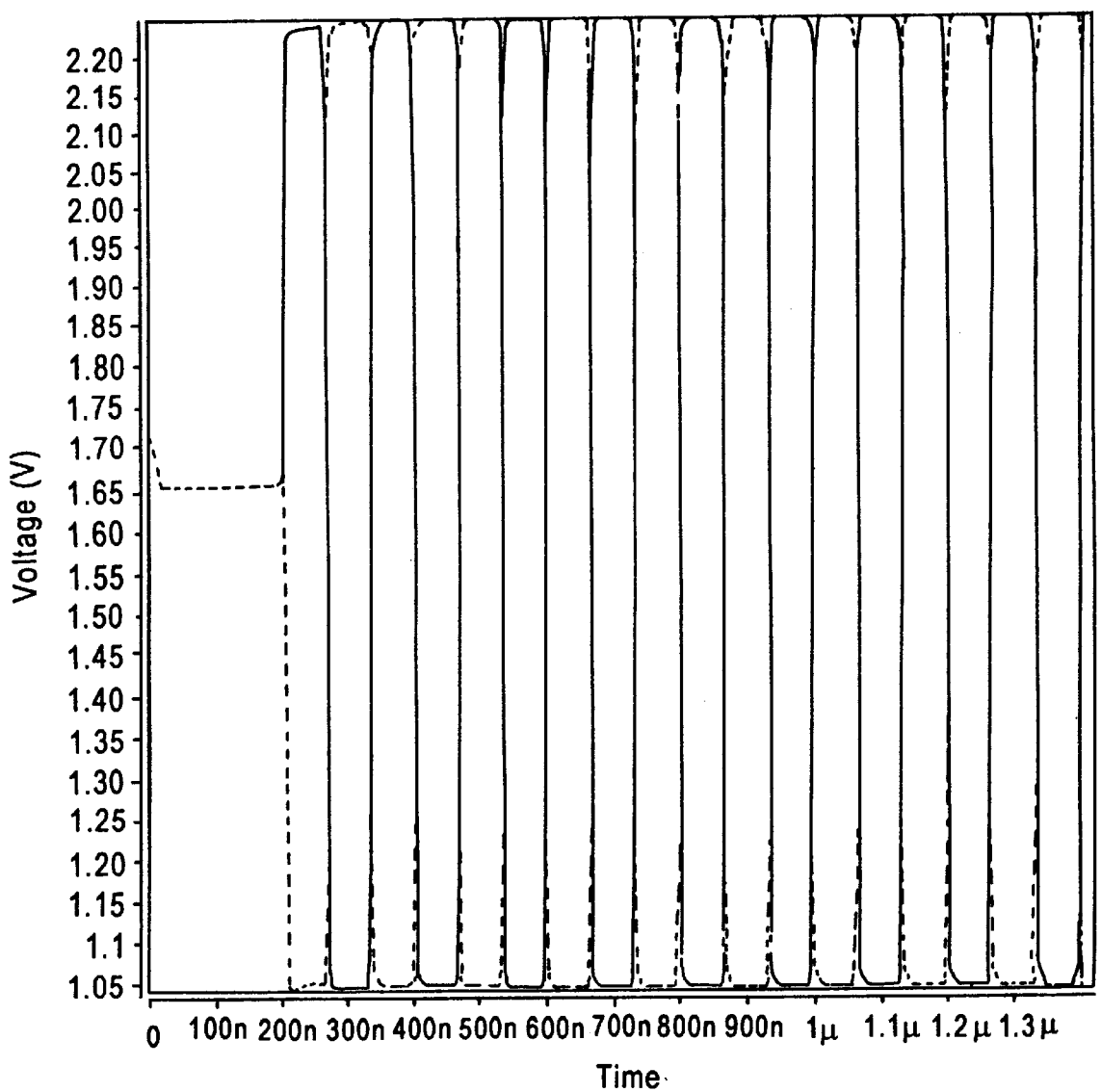
FIGS. 4A and 4B are graphs illustrating the output signals in high power mode and low power mode, respectively.
Figure 4B:
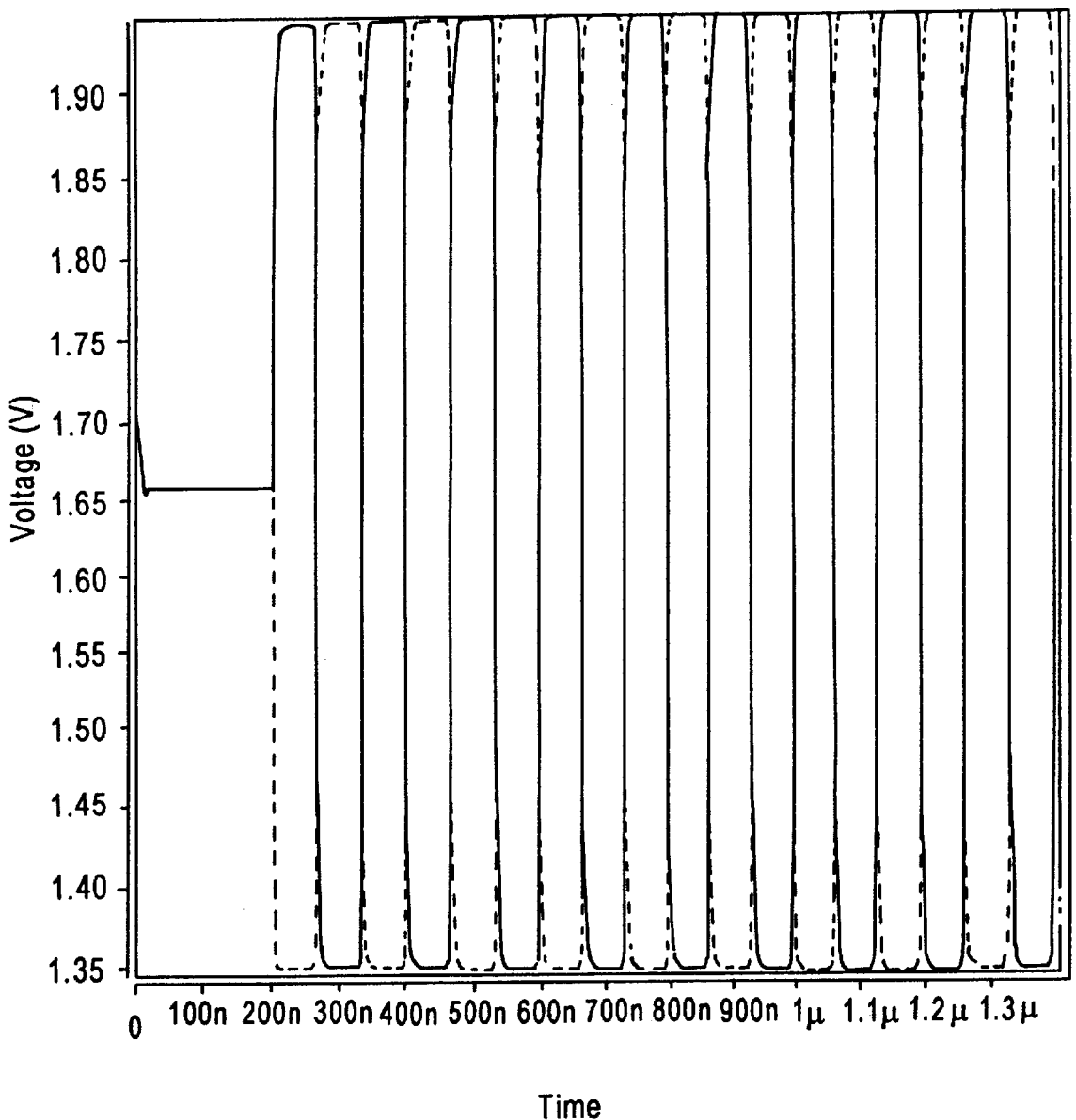
Figure 5:
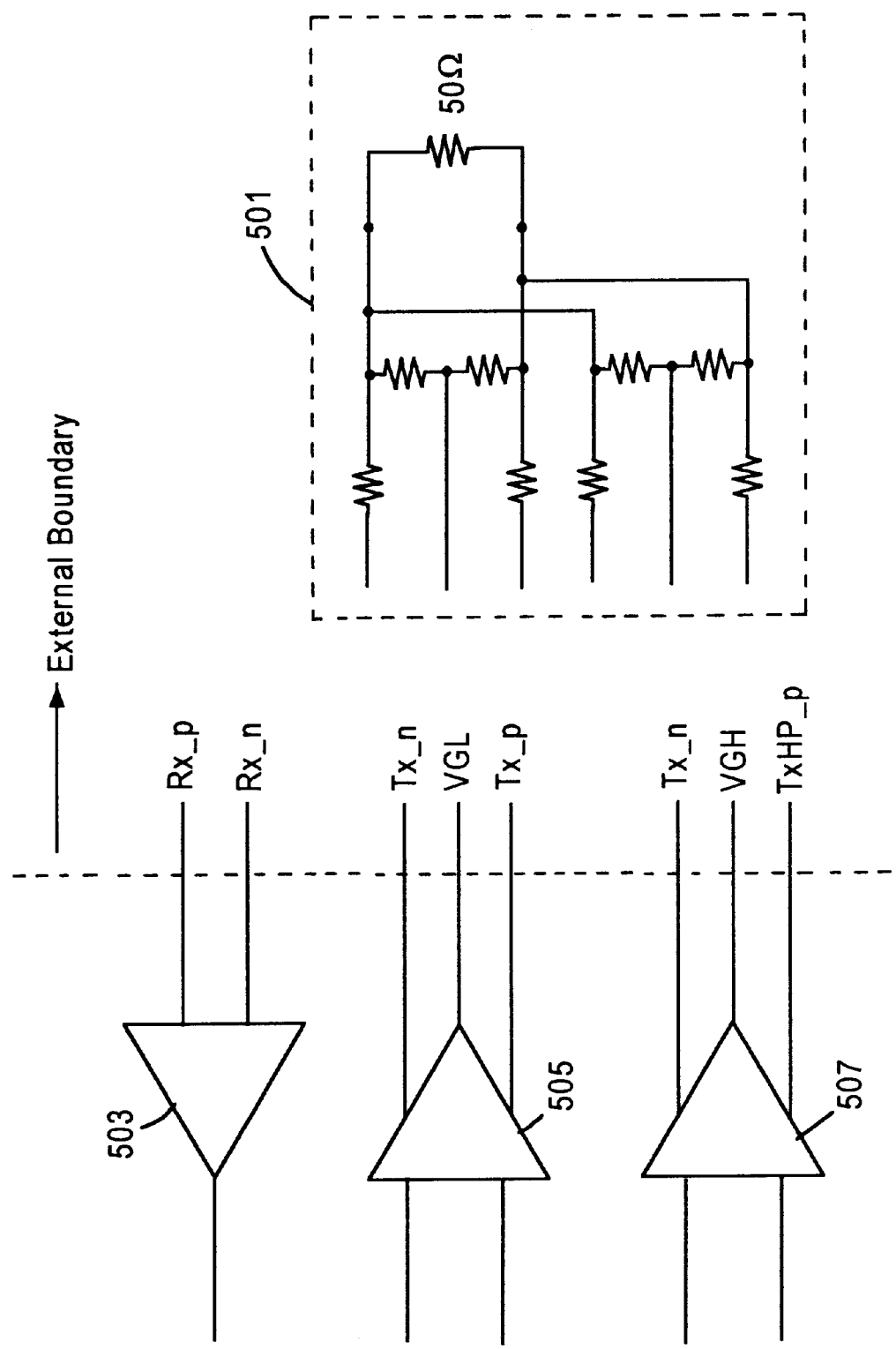
FIG. 5 is a diagram of a conventional line circuit.

FIGS. 4A and 4B illustrate the simulation results of the waveforms of the output current in the high power mode and the lower power mode, respectively. In FIG. 4a, the peak current value is approximately 2.2 volts, with a low value of about 1.05 volts. Thus, the peak-to-peak value is about 1.2 volts in the high power mode. In the low power mode as shown in FIG. 4b, the low value is about 1.35 volts, and the high is about 1.95 volts. The peak-to-peak value is approximately 0.6 volts. Therefore, from the low mode to the high mode, the peak to peak voltage level is doubled, from 0.6 volts to 1.2 volts.

According to the disclosed embodiment, two different power modes are supported by a single driver arrangement for the transmission of data signals over residential grade wiring. The arrangement allows the elimination of all external resistors and use of only two pins for the input and output terminals. This provides a significant reduction in manufacturing cost in terms of chip real estate and power consumption.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A line circuit for transmitting data signals as positive and negative output currents in a data communication network, comprising:
   a digitally controlled current source;
   a single current amplifier coupled to the digitally controlled current source for generating the positive output current and the negative output current in different power modes, the single current amplifier being driven by the digitally controlled current source; and
   a programmable digital control circuit coupled to the digitally controlled current source for controlling waveform shapes and edge rates of the positive output current and the negative output current, wherein the digitally controlled current source comprises:
   a first digital/analog convertor (DAC) coupled to the programmable digital control circuit for controlling the different power modes; and
   a second DAC coupled to the digital programmable control circuit and the first DAC.

2. The line circuit of claim 1, wherein the second DAC outputs a current input positive signal and a current input negative signal for input to the single current amplifier.

3. A line circuit for transferring data over residential grade wiring, comprising:
   programmable control logic configured for generating a digital power level control (DLC) signal, a positive control signal, and a negative control signal, wherein the DLC signal specifies a high power mode or a low power mode, and the positive control signal and the negative control signal indicate waveform shape and edge rate information associated with a positive output current and a negative output current;
   a front-end digital/analog convertor (DAC) configured for receiving the DLC signal and generating an output signal of the specified power mode;
   an intermediate DAC configured for receiving the output signal of the front-end DAC, the positive control signal, and the negative control signal, the intermediate DAC outputting a positive current signal and a negative current signal; and
   a single differential current amplifier configured for receiving the positive current signal and the negative current signal, and for generating correspondingly the positive output current and the negative output current in the high power mode or the low power mode.

4. The line circuit of claim 3, further comprising only two nodes for supplying the positive output current and the negative output current and for receiving incoming data signals, wherein the high power mode exhibits a peak to peak value that is about twice as high as the peak to peak value of the low power mode.

5. A method for transmitting data signals over a data communication network utilizing residential cabling, the method comprising:
   supplying control information to a digitally controlled current source;
   driving a single current amplifier in response to the supplying step;
   outputting a positive current and a negative current by the single current amplifier in different power modes based upon the control information; and
   storing the control information in a programmable digital control circuit, wherein the control information specifies waveform shapes and edge rates of the positive output current and the negative output current and the power mode, wherein the step of supplying comprises:
   generating a digital power level control (DLC) signal that indicates the power mode, the DLC signal being received by a first DAC; and
   generating a voltage controlled positive (Vcp) signal and a voltage controlled negative (Vcn) signal to control waveform shapes and edge rates of the positive output current and the negative output current, respectively, along with the power mode, the Vcp and Vcn signals being received by a second DAC.

* * * * *